(12) United States Patent
Mizuno et al.

(10) Patent No.: US 11,588,080 B2
(45) Date of Patent: Feb. 21, 2023

(54) OPTICAL APPARATUS AND THREE-DIMENSIONAL MODELING APPARATUS

(71) Applicant: SCREEN HOLDINGS CO., LTD., Kyoto (JP)

(72) Inventors: Hirofumi Mizuno, Kyoto (JP); Yoshimi Hashimoto, Kyoto (JP); Yasumitsu Fujisawa, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 17/219,209

(22) Filed: Mar. 31, 2021

(65) Prior Publication Data
US 2021/0313492 A1 Oct. 7, 2021

(30) Foreign Application Priority Data
Apr. 6, 2020 (JP) .............................. JP2020-068194

(51) Int. Cl.
*H01L 33/50* (2010.01)
*F21V 13/12* (2006.01)
(Continued)

(52) U.S. Cl.
CPC ............ *H01L 33/504* (2013.01); *F21V 13/12* (2013.01); *H01L 33/58* (2013.01); *F21Y 2115/10* (2016.08); *F21Y 2115/30* (2016.08)

(58) Field of Classification Search
CPC ....... H01L 33/504; H01L 33/58; F21V 13/12; F21Y 2115/10; F21Y 2115/30;
(Continued)

(56) References Cited

U.S. PATENT DOCUMENTS

| 7,583,444 B1 | 9/2009 | DeVoe et al. |
| 2005/0006597 A1 | 1/2005 | Wolleschensky |

(Continued)

FOREIGN PATENT DOCUMENTS

| CN | 107132231 A | 9/2017 |
| CN | 107430345 A | 12/2017 |

(Continued)

OTHER PUBLICATIONS

Extended European Search Report issued in corresponding European Patent Application No. 21165856.2-1020, dated Nov. 10, 2021.

(Continued)

*Primary Examiner* — Anne M Hines
*Assistant Examiner* — Jose M Diaz
(74) *Attorney, Agent, or Firm* — McDermott Will & Emery LLP

(57) ABSTRACT

The illumination optical system includes a beam shaper which converts an intensity distribution of a laser beam in each of a short axis direction and a long axis direction, which is a Gaussian distribution, into an intensity distribution of a parallel beam on a modulation surface of the optical modulator in each of the short axis direction and the long axis direction, which is a top hat distribution. The modulation surface and an irradiated surface are optically conjugated with respect to the long axis direction by a third lens and a fourth lens. Further, the modulation surface and a front focus position of the fourth lens are optically conjugated with respect to the short axis direction by a first lens, a second lens, and the third lens. The fourth lens condenses a beam having a top hat distribution at the front focus position onto the irradiated surface.

12 Claims, 5 Drawing Sheets

(51) Int. Cl.
*H01L 33/58* (2010.01)
*F21Y 115/30* (2016.01)
*F21Y 115/10* (2016.01)

(58) Field of Classification Search
CPC .......... Y02P 10/25; B22F 12/40; B22F 12/41; B23K 26/0648; B23K 26/0738; B23K 26/342; B29C 64/153; B29C 64/268; B33Y 30/00; G02B 27/0927; G02B 27/0911; G02B 27/0966; G02B 27/18; G02B 13/08
See application file for complete search history.

(56) References Cited

U.S. PATENT DOCUMENTS

| | | |
|---|---|---|
| 2011/0240611 A1 | 10/2011 | Sandstrom |
| 2017/0361530 A1 | 12/2017 | Liu |
| 2018/0195694 A1 | 7/2018 | Jutte et al. |

FOREIGN PATENT DOCUMENTS

| | | | |
|---|---|---|---|
| DE | 10-2015-002537 A1 | | 9/2016 |
| JP | 2006072220 A | * | 3/2006 |
| JP | 2007-029959 A | | 2/2007 |
| JP | 2018-521478 A | | 8/2018 |

OTHER PUBLICATIONS

Chinese Office Action issued in corresponding Chinese Patent Application No. 202110358008.5, dated Sep. 29, 2022, with English translation.

* cited by examiner

OPTICAL APPARATUS AND THREE-DIMENSIONAL MODELING APPARATUS

TECHNICAL FIELD

The present invention relates to an optical apparatus which emits a modulated beam onto an irradiated surface on a target object, and a three-dimensional modeling apparatus which includes the optical apparatus.

CROSS REFERENCE TO RELATED APPLICATION

This application claims priority benefit under 35 U.S.C. Section 119 of Japanese Patent Application No. 2020-068194 filed in the Japan Patent Office on Apr. 6, 2020, the entire disclosure of which is incorporated herein by reference.

BACKGROUND ART

In recent years, an SLS (Selective Laser Sintering) type three-dimensional modeling apparatus has been used, which emits a modulated laser beam to a modeling material such as metal powder or the like and sinters the modeling material, to thereby perform three-dimensional modeling. In the three-dimensional modeling apparatus, an increase in the productivity is required, and it is considered that the power density (i.e., the light intensity per unit area) of the laser beam to be emitted to the modeling material should be increased. In an optical apparatus which modulates and emits the laser beam, however, if the power density of the laser beam entering an optical modulator is increased, the peak intensity (i.e., maximum intensity) of the laser beam having an intensity distribution which is a Gaussian distribution becomes too high and there arises a possibility that the optical modulator may be damaged.

On the other hand, National Publication of Translation No. 2018-521478 (Document 1) discloses a technique in which a light emitting apparatus used for stage lighting, a headlight, or the like is provided with a top-hat beam shaper for redistributing light having a first wavelength (for example, blue light) emitted from a laser diode or an LED into a beam having a spatially flat intensity distribution, to thereby improve the efficiency of converting the light having the first wavelength into light having a second wavelength (for example, yellow light) in a light conversion member.

In the above-described optical apparatus, it is thought that the amount of light to be inputted to the optical modulator can be increased without damaging the optical modulator by collimating the intensity distribution of the laser beam entering the optical modulator to be flat by using a top-hat beam shaper.

In this case, the intensity distribution of the laser beam collimated by the top-hat beam shaper becomes a top hat distribution on a modulation surface of the optical modulator, and becomes disordered at the other portions on an optical path. Therefore, since the intensity distribution of the laser beam is disordered even at a front focus position of a condensing lens for condensing the laser beam onto a target object, there is a possible problem that no main peak may appear in the intensity distribution of the laser beam at a back focus position (i.e., an irradiated surface on the target object) and the laser beam cannot be suitably condensed. Further, in a case where the intensity distribution of the laser beam emitted from the optical modulator is the Gaussian distribution, since the intensity distribution at the front focus position of the condensing lens is also the Gaussian distribution, the intensity distribution at the back focus position also becomes the Gaussian distribution and the laser beam can be suitably condensed.

SUMMARY OF INVENTION

The present invention is intended for an optical apparatus for emitting a modulated beam onto an irradiated surface on a target object, and it is an object of the present invention to increase the amount of light to be inputted to an optical modulator.

The optical apparatus according to one preferred embodiment of the present invention includes an illumination optical system for collimating a laser beam into a parallel beam which is long linear in a long axis direction, an optical modulator for modulating the parallel beam into a modulated beam, and a projection optical system for guiding the modulated beam onto an irradiated surface of a target object. The illumination optical system includes a beam shaper for converting an intensity distribution of the laser beam in each of a short axis direction and the long axis direction, which is a Gaussian distribution, into an intensity distribution of the parallel beam on a modulation surface of the optical modulator in each of the short axis direction and the long axis direction, which is a top hat distribution. The projection optical system includes a first lens, a second lens positioned on the forward side in the traveling direction of the modulated beam, relative to the first lens, a third lens positioned on the forward side in the traveling direction of the modulated beam, relative to the first lens, and a fourth lens positioned on the forward side in the traveling direction of the modulated beam, relative to the first lens, the second lens, and the third lens. The modulation surface and the irradiated surface are optically conjugated with respect to the long axis direction by the third lens and the fourth lens. The modulation surface and a front focus position of the fourth lens are optically conjugated with respect to the short axis direction by the first lens, the second lens, and the third lens. The fourth lens condenses a beam having a top hat distribution at the front focus position onto the irradiated surface.

In the optical apparatus, it is possible to increase the amount of light to be inputted to the optical modulator.

Preferably, the third lens is positioned on the forward side in the traveling direction of the modulated beam, relative to the second lens.

Preferably, the projection optical system further includes a long axis side light shielding part which is positioned between the third lens and the fourth lens and blocks a non-zero-order diffracted beam on a long axis side from the optical modulator and a short axis side light shielding part which is positioned between the first lens and the second lens and between the first lens and the third lens and blocks a non-zero-order diffracted beam on a short axis side from the optical modulator.

Preferably, the optical modulator includes a plurality of modulator elements which are two-dimensionally arranged.

Preferably, the optical modulator is a PLV (Planar Light Valve).

The present invention is also intended for a three-dimensional modeling apparatus. The three-dimensional modeling apparatus according to one preferred embodiment of the present invention includes the above-described optical apparatus, a laser light source for emitting the laser beam to the optical apparatus, and a scanning part which is the target object irradiated with the modulated beam from the optical apparatus and scans the modulated beam on a modeling material.

Preferably, the scanning part includes a galvanometer mirror which rotates to change the traveling direction of the modulated beam.

These and other objects, features, aspects and advantages of the present invention will become more apparent from the following detailed description of the present invention when taken in conjunction with the accompanying drawings.

DESCRIPTION OF EMBODIMENTS

Figure 1:
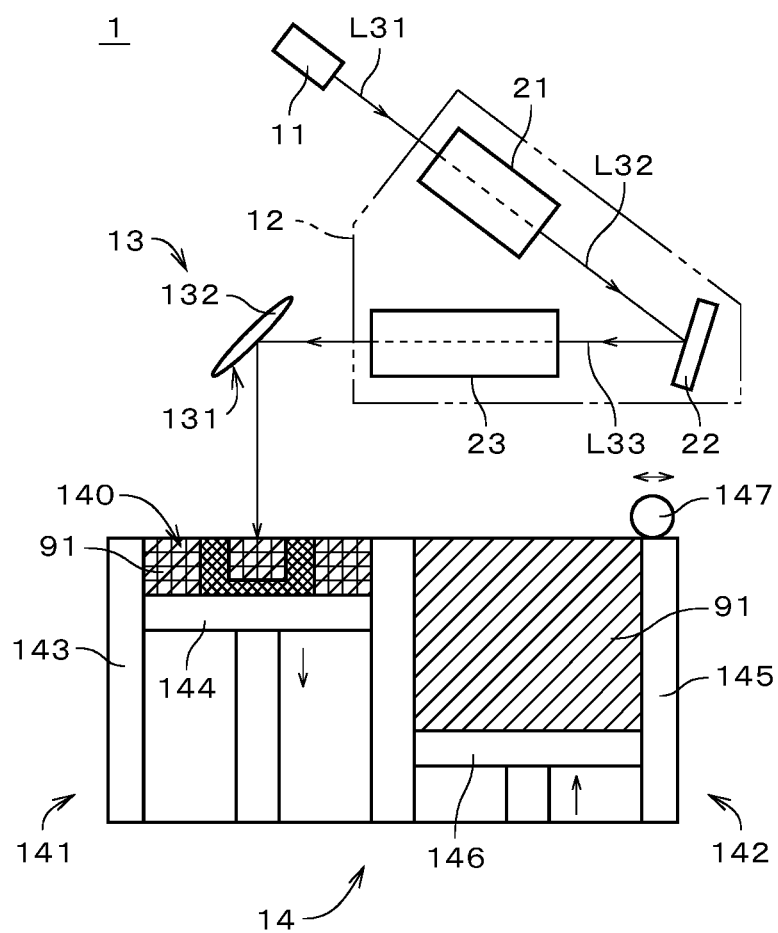
FIG. 1 is a diagram showing a configuration of a three-dimensional modeling apparatus in accordance with one preferred embodiment.

FIG. 1 is a diagram showing a configuration of a three-dimensional modeling apparatus 1 in accordance with one preferred embodiment of the present invention. The three-dimensional modeling apparatus 1 is an SLS (Selective Laser Sintering) type three-dimensional modeling apparatus which emits a modulated laser beam to a powdery or pasty modeling material and sinters or melts the modeling material, to thereby perform three-dimensional modeling. The modeling material is, for example, a metal, engineering plastics, ceramics, a synthetic resin, or the like. The modeling material may contain a plurality of kinds of materials.

The three-dimensional modeling apparatus 1 includes a laser light source 11, an optical apparatus 12, a scanning part 13, and a material feeding mechanism 14. In the three-dimensional modeling apparatus 1, a laser beam L31 emitted from the laser light source 11 is guided to the scanning part 13 by the optical apparatus 12 and scanned on a modeling material 91 inside a modeling space 140 of the material feeding mechanism 14 by the scanning part 13. A portion of the modeling material 91 which is irradiated with the laser beam is sintered. Then, by repeating the supply of the modeling material 91 into the modeling space 140 and the scan of the laser beam on the modeling material 91, a three-dimensional model is formed. In FIG. 1, for easy understanding of this figure, constituent elements of the optical apparatus 12 are surrounded by a two-dot chain line.

In the three-dimensional modeling apparatus 1, the constituent elements such as the laser light source 11, the optical apparatus 12 (for example, an optical modulator 22 described later), the scanning part 13, the material feeding mechanism 14, and the like are controlled by a not-shown control part on the basis of design data (e.g., CAD data) or the like of a three-dimensional model to be produced. The control part is, for example, an ordinary computer including a processor, a memory, an input/output part, and a bus.

The laser light source 11 emits the laser beam L31 to the optical apparatus 12. The laser light source 11 is, for example, a fiber laser light source. The wavelength of the laser beam L31 is, for example, 1.070 μm.

The optical apparatus 12 modulates the laser beam L31 from the laser light source 11 into a modulated beam L33 and emits the modulated beam L33 to the scanning part 13. The optical apparatus 12 includes an illumination optical system 21, an optical modulator 22, and a projection optical system 23. The illumination optical system 21 and the projection optical system 23 each include a plurality of optical elements such as lenses or the like, as described later.

The illumination optical system 21 collimates the laser beam L31 from the laser light source 11 into a parallel beam L32 which is substantially long linear in one direction (hereinafter, referred to as a "long axis direction") and guides the parallel beam L32 to the optical modulator 22. In other words, the cross-sectional shape of the parallel beam L32 is a substantially linear shape which is long in the long axis direction and short in a short axis direction perpendicular to the long axis direction. The cross-sectional shape of the parallel beam L32 is the shape of the parallel beam L32 in a plane perpendicular to the traveling direction of the parallel beam L32. In the following description, the cross section of light refers to a cross section of the light in a plane perpendicular to the traveling direction of the light. The cross-sectional shape of the parallel beam L32 can be regarded to be substantially rectangular. The cross section of the parallel beam L32 has the same size at any position in the traveling direction of the parallel beam L32. The shape of an irradiation region of the parallel beam L32 on the optical modulator 22 is, for example, a substantially linear (or substantially rectangular) shape having a length of 28 mm in the long axis direction and a length of 1 mm in the short axis direction.

The optical modulator 22 modulates the parallel beam L32 from the illumination optical system 21 into the modulated beam L33 and guides the modulated beam L33 to the projection optical system 23. As the optical modulator 22, for example, a PLV (Planar Light Valve), a GLV (Grating Light Valve) (registered trademark), a DMD (Digital Micromirror Device), or the like can be used. In the present preferred embodiment, the optical modulator 22 is an LPLV (Liner Planar Light Valve) which is a kind of the PLY.

Figure 2:
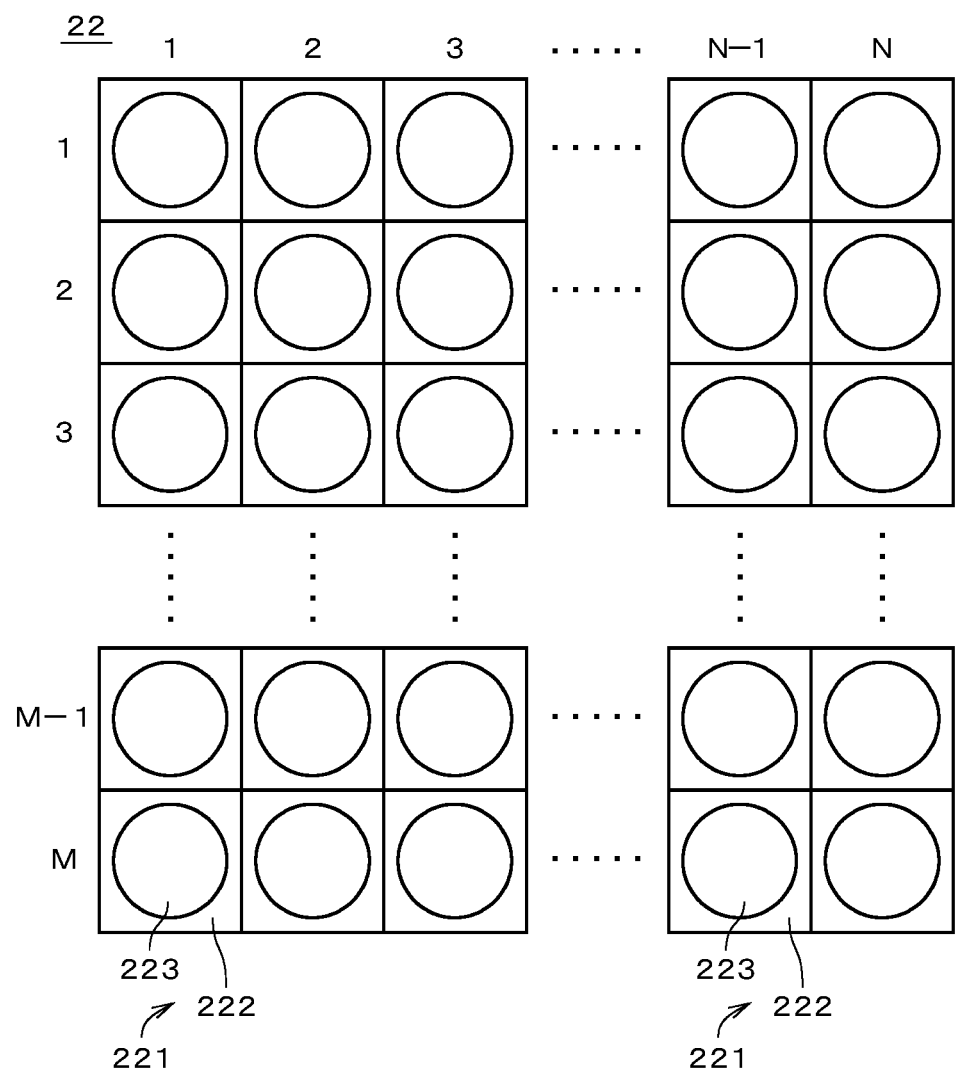
FIG. 2 is a view showing a structure of an optical modulator.

FIG. 2 is a view showing a simplified structure of the optical modulator 22 (i.e., LPLV). The optical modulator 22 includes a plurality of substantially rectangular pixels 221 which are arranged adjacently in a matrix (i.e., two-dimensionally arrayed) on a not-shown substrate. In the optical modulator 22, a surface of the plurality of pixels 221 serves as a modulation surface. In the exemplary case shown in FIG. 2, arranged are M pixels 221 in a longitudinal direction and N pixels 221 in a transverse direction of this figure. The transverse direction in FIG. 2 corresponds to the long axis direction of the parallel beam L32 (see FIG. 1) and the longitudinal direction in FIG. 2 corresponds to the short axis direction of the parallel beam L32.

Each pixel 221 is a modulator element including a fixed member 222 and a movable member 223. The fixed member 222 is a planar and substantially rectangular member fixed to the above-described substrate and provided with a substantially circular opening at its center. The movable member 223 is a substantially circular member provided in the opening of the fixed member 222. On an upper surface of the fixed member 222 (i.e., a plane of this side in a direction perpendicular to this drawing paper in FIG. 2), provided is a fixed reflection surface. On an upper surface of the movable member 223, provided is a movable reflection surface. The movable member 223 is movable in the direction perpendicular to this drawing paper in FIG. 2.

In each pixel 221, by changing a relative position between the fixed member 222 and the movable member 223, a reflected light beam from the pixel 221 is switched between a zero-order beam (i.e., a specularly reflected light beam) and a non-zero-order diffracted beam. In other words, in the pixel 221, when the movable member 223 moves relatively to the fixed member 222, light modulation using a diffraction grating is performed. The zero-order beam emitted from the optical modulator 22 is guided to the scanning part 13 by the projection optical system 23 (see FIG. 1). Further, the non-zero-order diffracted beam (mainly a first-order diffracted beam) emitted from the optical modulator 22 is guided toward any direction other than the direction toward the scanning part 13 and blocked.

In the projection optical system 23, the reflected light beams from the M pixels 221 (hereinafter, also referred to as a "pixel row") aligned in the longitudinal direction of FIG. 2 are integrated and emitted to the scanning part 13 as the modulated beams L33. The power density of the modulated beam L33 emitted from the scanning part 13 to the modeling material 91 can be thereby increased. In the optical modulator 22, the M pixels 221 in one pixel row (i.e., M modulator elements) can be regarded as one modulation element corresponding to one unit space. The optical modulator 22 functions as an optical modulator including N modulation elements aligned in the long axis direction of the parallel beam L32 on the optical modulator 22.

The projection optical system 23 shown in FIG. 1 condenses and guides the modulated beam L33 from the optical modulator 22 to the scanning part 13. In other words, the scanning part 13 is a target object onto which the modulated beam L33 is guided by the optical apparatus 12. The modulated beam L33 is emitted onto an irradiated surface 131 of the scanning part 13.

The scanning part 13 reflects the modulated beam L33 from the projection optical system 23 of the optical apparatus 12 and scans the modulated beam L33 on the modeling material 91 inside the modeling space 140 of the material feeding mechanism 14. As the scanning part 13, for example, a galvano scanner, a polygon laser scanner, or the like can be used. In the present preferred embodiment, the scanning part 13 is a galvano scanner including a galvanometer mirror 132 and a galvano motor (not shown), and a reflection surface of the galvanometer mirror 132 serves as the above-described irradiated surface 131. In the scanning part 13, the galvanometer mirror 132 is rotated by the galvano motor and the traveling direction of the modulated beam L33 reflected by the galvanometer mirror 132 is thereby changed. As a result, the modulated beam L33 emitted onto the modeling material 91 is scanned in a scan direction corresponding to the short axis direction of the modulated beam L33.

The material feeding mechanism 14 includes a modeling part 141 and a feeding part 142. The modeling part 141 includes a first cylinder 143 and a first piston 144. The first cylinder 143 is a tubular member extending in an up-and-down direction. The plan-view shape of an internal space of the first cylinder 143 is, for example, substantially rectangular. The first piston 144 is a substantially flat plate-like or substantially columnar member which is accommodated in the internal space of the first cylinder 143, and the plan-view shape thereof is almost the same as that of the internal space of the first cylinder 143. The first piston 144 is movable in the up-and-down direction inside the internal space of the first cylinder 143. In the modeling part 141, a three-dimensional space surrounded by an inner surface of the first cylinder 143 and an upper surface of the first piston 144 serves as the modeling space 140 in which the three-dimensional modeling is performed by using the modulated beam L33.

The feeding part 142 includes a second cylinder 145, a second piston 146, and a squeegee 147. The second cylinder 145 is a tubular member extending in the up-and-down direction and disposed adjacent to the side of the first cylinder 143. The plan-view shape of an internal space of the second cylinder 145 is, for example, substantially rectangular. The second piston 146 is a substantially flat plate-like or substantially columnar member which is accommodated in the internal space of the second cylinder 145, and the plan-view shape thereof is almost the same as that of the internal space of the second cylinder 145. The second piston 146 is movable in the up-and-down direction inside the internal space of the second cylinder 145. In the feeding part 142, a three-dimensional space surrounded by an inner surface of the second cylinder 145 and an upper surface of the second piston 146 serves as a pooling space for storing the modeling material 91 which is to be supplied to the modeling part 141. The squeegee 147 is a rodlike (e.g., substantially columnar) member extending in a horizontal direction across an upper opening of the second cylinder 145. The squeegee 147 is movable in the horizontal direction along an upper end surface of the second cylinder 145.

In the feeding part 142, the second piston 146 goes up for a predetermined distance and the modeling material 91 inside the second cylinder 145 is thereby lifted upward. Then, the squeegee 147 moves from on the second cylinder 145 to on the first cylinder 143, and the modeling material 91 protruded upward from the upper end surface of the second cylinder 145 is thereby supplied into the modeling space 140 of the modeling part 141. An upper surface of the modeling material 91 held inside the modeling space 140 is positioned at a predetermined height (for example, at the same height as that of an upper end surface of the first cylinder 143).

In the three-dimensional modeling apparatus 1, the above-described modulated beam L33 is scanned on the modeling material 91 inside the modeling space 140. With this scanning, in a surface layer portion of the modeling material 91 inside the modeling space 140, a portion irradiated with the modulated beam L33 is sintered, and this portion corresponds to one layer among a plurality of layers laminated in the up-and-down direction, which are obtained by dividing the three-dimensional model. After the above-described scan of the modulated beam L33 on the modeling material 91 inside the modeling space 140 is finished, the first cylinder 143 goes down for the predetermined distance. After that, as described above, the modeling material 91 is supplied into the modeling space 140 from the feeding part 142 and the modulated beam L33 is scanned. In the three-dimensional modeling apparatus 1, by repeating the supply of the modeling material 91 into the modeling space 140 and the scan of the modulated beam L33 on the modeling material 91 inside the modeling space 140, the three-dimensional model is formed inside the modeling space 140.

Figure 3:
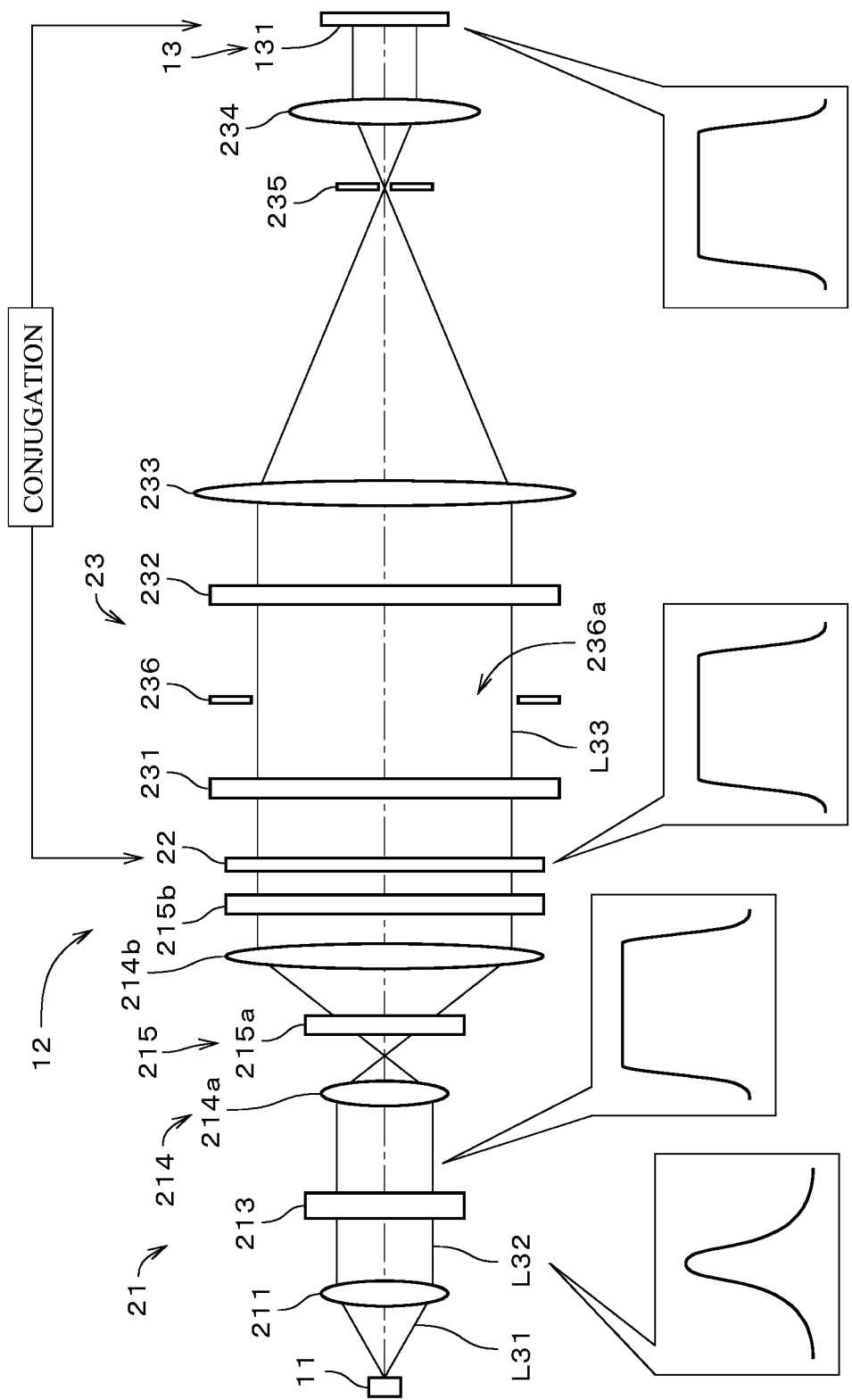
FIG. 3.
Figure 4:
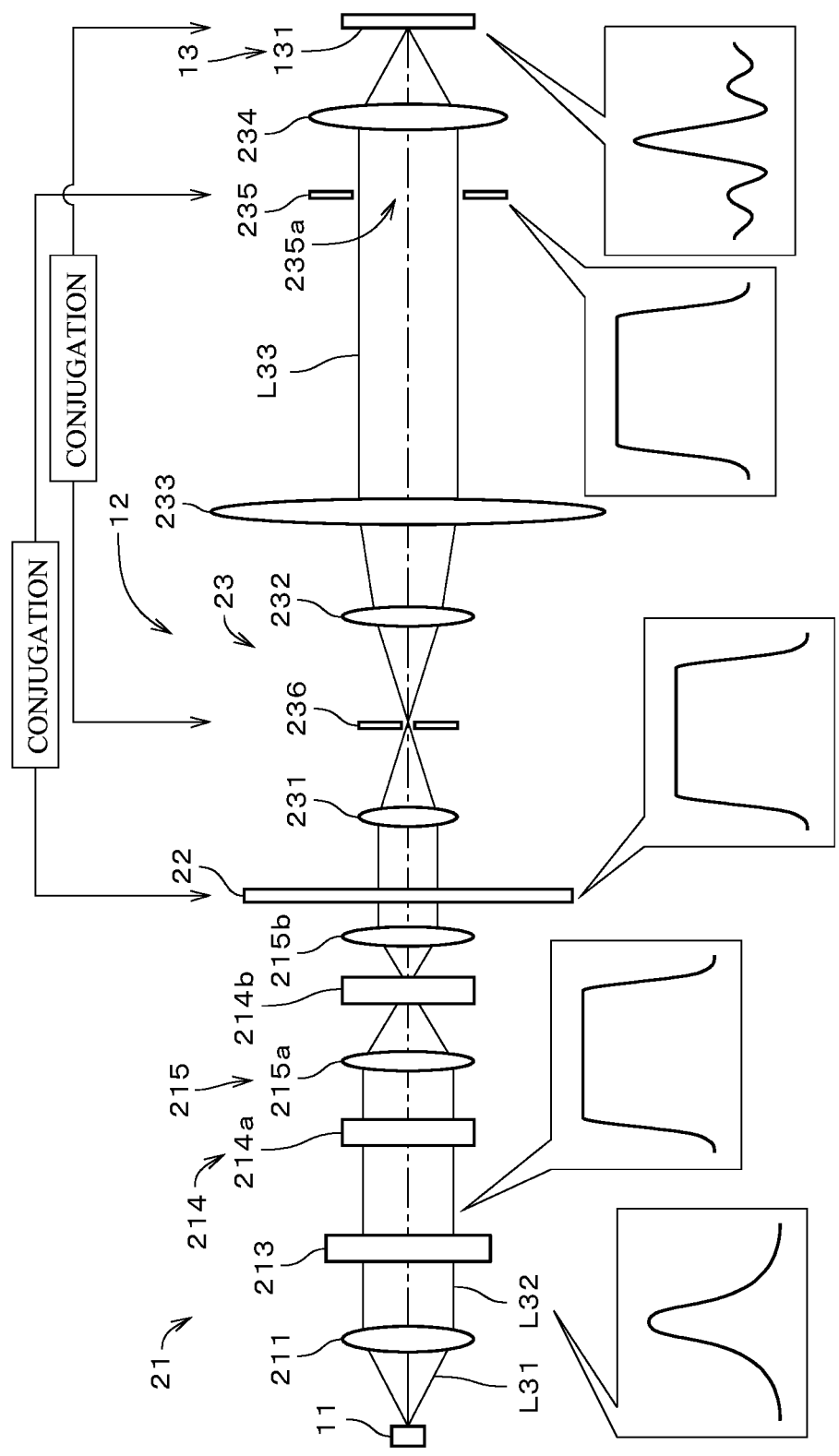
FIG. 4 are diagrams each showing a configuration of an optical apparatus and an optical path in the optical apparatus.

Next, with reference to FIGS. 3 and 4, a detailed configuration of the optical apparatus 12 will be described. In FIG. 3, an optical path of the parallel beam L32 and the modulated beam L33 is shown so that the short axis direction of the parallel beam L32 and the modulated beam L33 may coincide with the direction perpendicular to this drawing paper. In FIG. 3, the long axis direction of the parallel beam L32 and the modulated beam L33 coincides with the up-and-down direction in this figure. Further, in FIG. 4, the optical path of the parallel beam L32 and the modulated beam L33 is shown so that the long axis direction of the parallel beam L32 and the modulated beam L33 may coincide with the direction perpendicular to this drawing paper. In FIG. 4, the short axis direction of the parallel beam L32 and the modulated beam L33 coincides with the up-and-down direction in this figure.

The illumination optical system 21 of the optical apparatus 12 includes a collimator lens 211, a beam shaper 213, and cylinder lenses 214 and 215. The collimator lens 211, the beam shaper 213, and the cylinder lenses 214 and 215 are arranged in this order in the traveling direction going from the laser light source 11 toward the optical modulator 22. The collimator lens 211 is, for example, a cylindrical lens. Further, in the exemplary case shown in FIGS. 3 and 4, one collimator lens 211 is provided but two or more collimator lenses 211 may be provided. The collimator lens 211 has only to generate parallel light, and the lens shape thereof may be spherical, aspherical, or cylindrical.

The beam shaper 213 is a top-hat beam shaper which converts a distribution of light intensity (hereinafter, also referred to simply as an "intensity distribution") on a cross section of the parallel beam L32 in each of the short axis direction and the long axis direction, from a Gaussian distribution into a top hat distribution in which the width of a region of the maximum intensity is wide (in other words, whose top portion is substantially flat).

The cylinder lenses 214 and 215 form a rectangle image generated when the parallel beam L32 goes through the beam shaper 213, on the modulation surface of the optical modulator 22 described later, in the short axis direction and the long axis direction at different magnifications. The cylinder lens 214 includes a cylinder lens 214a and a cylinder lens 214b for magnifying the top hat distribution in the long axis direction. Further, the cylinder lens 215 includes a cylinder lens 215a and a cylinder lens 215b for magnifying the top hat distribution in the short axis direction. In the exemplary case shown in FIGS. 3 and 4, the cylinder lens 214a, the cylinder lens 215a, the cylinder lens 214b, and the cylinder lens 215b are arranged in this order in the traveling direction from the laser light source 11 toward the optical modulator 22.

Further, in the illumination optical system 21, an optical element other than the above lenses may be added. Furthermore, in the illumination optical system 21, the cylinder lenses 214 and 215 do not always need to be provided but, for example, a beam shaper 213 for forming a rectangle image having a desired size on the modulation surface of the optical modulator 22 may be used.

As described above, the illumination optical system 21 converts the laser beam L31 emitted from the laser light source 11 into the parallel beam L32 and guides the parallel beam L32 to the optical modulator 22. The intensity distribution on the cross section of the laser beam L31 entering the illumination optical system 21 in each of the short axis direction and the long axis direction is a Gaussian distribution. Though there are some actual cases where this intensity distribution is not an exact Gaussian distribution but is a distribution having a form approximate to the Gaussian function, both the exact Gaussian distribution and the distribution close to the Gaussian distribution are collectively referred to each as a "Gaussian distribution" in the following description.

In the illumination optical system 21, the laser beam L31 emitted from the laser light source 11 goes through the collimator lens 211, to thereby become parallel light in each of the short axis direction and the long axis direction, becoming the parallel beam L32. The parallel beam L32 goes through the beam shaper 213 and the cylinder lenses 214 and 215, to be guided to the optical modulator 22. The intensity distribution of the parallel beam L32 before entering the beam shaper 213 is a Gaussian distribution in the long axis direction and a Gaussian distribution also in the short axis direction as shown in a rectangle frame on the lower side of the optical path diagram in each of FIGS. 3 and 4.

When the parallel beam L32 goes through the beam shaper 213, the intensity distribution of the parallel beam L32 in each of the short axis direction and the long axis direction is converted from the Gaussian distribution to the top hat distribution (also referred to as a rectangular distribution), as shown in a rectangle frame on the lower side of the optical path diagram in each of FIGS. 3 and 4. Therefore, the intensity distribution of the parallel beam L32 which goes through the beam shaper 213 and enters the optical modulator 22 (i.e., the intensity distribution of the parallel beam L32 on the modulation surface of the optical modulator 22), in each of the short axis direction and the long axis direction, is the top hat distribution.

The projection optical system 23 includes a first lens 231, a second lens 232, a third lens 233, a fourth lens 234, a long axis side light shielding part 235, and a short axis side light shielding part 236. The first lens 231 and the second lens 232 are each, for example, a cylindrical convex lens. The third lens 233 and the fourth lens 234 are each, for example, a spherical convex lens. The long axis side light shielding part 235 is, for example, a flat plate-like member provided with an opening 235a having a rectangular shape extending in parallel with the short axis direction, at a center portion thereof. The short axis side light shielding part 236 is, for example, a flat plate-like member provided with an opening 236a having a rectangular shape extending in parallel with the long axis direction, at a center portion thereof. The material for the long axis side light shielding part 235 and the short axis side light shielding part 236 is, for example, a metal such as stainless steel or the like, ceramics, or the like.

The second lens 232 and the third lens 233 are positioned on the forward side in the traveling direction of the modulated beam L33 (i.e., on the side toward which the modulated beam L33 goes, traveling from the optical modulator 22 to the scanning part 13), relative to the first lens 231. In the other words, the second lens 232 and the third lens 233 are positioned on the side closer to the scanning part 13, relative to the first lens 231, on the optical path of the modulated beam L33. In the exemplary case shown in FIGS. 3 and 4, the third lens 233 is positioned on the forward side in the traveling direction of the modulated beam L33, relative to the second lens 232. The third lens 233 may be disposed between the first lens 231 and the second lens 232. The fourth lens 234 is positioned on the forward side in the traveling direction of the modulated beam L33, relative to the first lens 231, the second lens 232, and the third lens 233.

In the projection optical system 23, it is preferable that a front focus position (i.e., a focus position on the side of the optical modulator 22) on a short axis side of the first lens 231 and the modulation surface of the optical modulator 22 should coincide with each other. Thus, by setting the distance between the optical modulator 22 and the first lens 231 to be the front focal length of the first lens 231 or less (preferably, less than the front focal length), the focal point distance between the zero-order diffracted beam and the first-order diffracted beam generated after the light goes through the first lens 231 is increased. As a result, the zero-order diffracted beam can be easily separated from the non-zero-order diffracted beam such as the first-order diffracted beam or the like. Further, a front focus position of the third lens 233 and the modulation surface of the optical modulator 22 coincide with each other. A back focus position on the short axis side of the first lens 231 (i.e., the focus position on the side of the scanning part 13) coincides with a front focus position on the short axis side of the second lens 232 and the third lens 233. A back focus position of the third lens 233 coincides with a front focus position of the fourth lens 234, and a back focus position of the fourth lens 234 coincides with the irradiated surface 131 of the scanning part 13.

In the projection optical system 23, the modulation surface of the optical modulator 22 and the irradiated surface 131 of the scanning part 13 are optically conjugated with respect to the long axis direction by the third lens 233 and the fourth lens 234. Further, the modulation surface of the optical modulator 22 and the front focus position of the fourth lens 234 are optically conjugated with respect to the short axis direction by the first lens 231, the second lens 232, and the third lens 233. The fourth lens 234 condenses the modulated beam L33 onto the irradiated surface 131 of the scanning part 13 with respect to the short axis direction. The irradiated surface 131 of the scanning part 13 and the back focus position of the first lens 231 optically conjugated with respect to the short axis direction by the second lens 232, the third lens 233, and the fourth lens 234.

In the exemplary case shown in FIGS. 3 and 4, the first lens 231, the short axis side light shielding part 236, the second lens 232, the third lens 233, the long axis side light shielding part 235, and the fourth lens 234 are arranged in this order in the traveling direction from the optical modulator 22 toward the scanning part 13. The short axis side light shielding part 236 is positioned between the first lens 231 and the second lens 232. Further, in a case where the third lens 233 is disposed between the first lens 231 and the second lens 232, the short axis side light shielding part 236 is positioned between the first lens 231 and the third lens 233. Specifically, the short axis side light shielding part 236 is disposed in the vicinity of a condensing position in the short axis direction of the modulated beam L33 between the first lens 231 and the second lens 232 and between the first lens 231 and the third lens 233. The short axis side light shielding part 236 is disposed, for example, at the back focus position on the short axis side of the first lens 231. Further, the long axis side light shielding part 235 is disposed in the vicinity of a condensing position in the long axis direction of the modulated beam L33 between the third lens 233 and the fourth lens 234. The long axis side light shielding part 235 is disposed, for example, at the back focus position of the third lens 233.

Further, in the projection optical system 23, the types of the first lens 231, the second lens 232, the third lens 233, and the fourth lens 234 may be changed in various manners, and an optical element other than the above-described ones may be additionally provided. Furthermore, respective materials, shapes, and structures of the long axis side light shielding part 235 and the short axis side light shielding part 236 may be changed in various manners.

As described above, the projection optical system 23 guides the modulated beam L33 from the optical modulator 22 to the scanning part 13. In detail, the modulated beam L33 which is parallel light generated in the optical modulator 22 goes through the first lens 231 and is thereby condensed at the back focus position of the first lens 231 (i.e., a front composite focus position of the second lens 232 and the third lens 233) in the short axis direction. The modulated beam L33 is not refracted when the modulated beam L33 goes through the first lens 231 with respect to the long axis direction.

Figure 5:
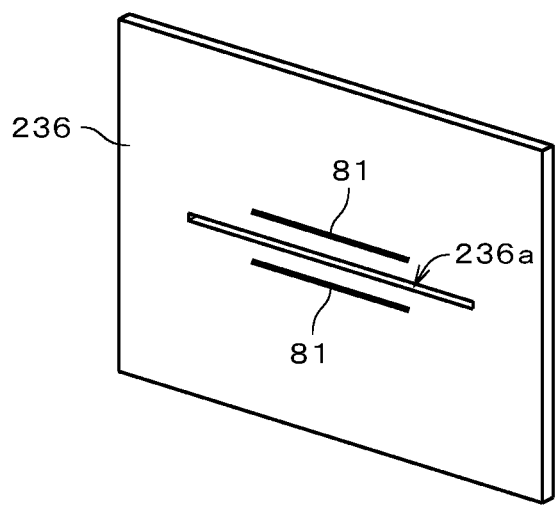
FIG. 5 is a perspective view showing a short axis side light shielding part.

The modulated beam L33 which has passed through the first lens 231 goes through the opening 236a of the short axis side light shielding part 236 which is positioned at the back focus position on the short axis side of the first lens 231. In detail, out of the reflected light beam reflected by the optical modulator 22, the zero-order beam and the non-zero-order diffracted beam on the long axis side go through the rectangular opening 236a of the short axis side light shielding part 236, and the non-zero-order diffracted beam on the short axis side (mainly the first-order diffracted beam (i.e., +1st order diffracted beam and −1st order diffracted beam)) is blocked by the short axis side light shielding part 236. As shown in FIG. 5, the non-zero-order diffracted beam on the short axis side is emitted to substantially linear irradiation regions 81 extending in the long axis direction at respective portions on the upper side and the lower side of the opening 236a of the short axis side light shielding part 236 (i.e., both sides of the opening 236a in the short axis direction).

The cross section of the modulated beam L33 which has passed through the opening 236a of the short axis side light shielding part 236 becomes wider in the short axis direction as the modulated beam L33 goes toward the traveling direction. The modulated beam L33 which has passed through the short axis side light shielding part 236 goes through the second lens 232 and the third lens 233, to thereby become parallel light. The modulated beam L33 is not refracted when the modulated beam L33 goes through the second lens 232 in the long axis direction, and goes through the third lens 233, to be thereby condensed at the back focus position of the third lens 233 (i.e., the front focus position of the fourth lens 234).

Figure 6:
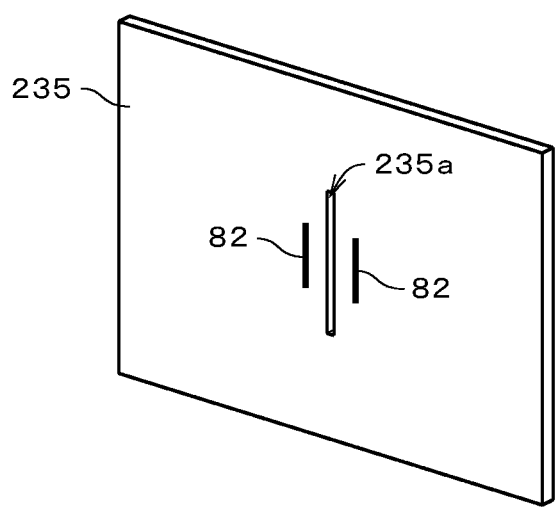
FIG. 6 is a perspective view showing a long axis side light shielding part.

The modulated beam L33 which has passed through the second lens 232 and the third lens 233 goes through the opening 235a of the long axis side light shielding part 235 which is positioned at the back focus position of the third lens 233. In detail, out of the reflected light beam reflected by the optical modulator 22, the zero-order beam goes through the rectangular opening 235a of the long axis side light shielding part 235, and the non-zero-order diffracted beam on the long axis side (mainly the first-order diffracted beam) is blocked by the long axis side light shielding part 235. As shown in FIG. 6, the non-zero-order diffracted beam on the long axis side is emitted to substantially linear irradiation regions 82 extending in the short axis direction at respective portions on the left side and the right side of the opening 235a of the long axis side light shielding part 235 (i.e., both sides of the opening 235a in the long axis direction) in this figure.

The cross section of the modulated beam L33 which has passed through the opening 235a of the long axis side light shielding part 235 becomes wider in the long axis direction as the modulated beam L33 goes toward the traveling direction. The modulated beam L33 which has passed through the long axis side light shielding part 235 goes through the fourth lens 234, to thereby become parallel light in the long axis direction, and enters the irradiated surface 131 of the scanning part 13. Further, the modulated beam L33 entering the fourth lens 234 as the parallel light in the short axis direction goes through the fourth lens 234, to be thereby condensed onto the irradiated surface 131 of the scanning part 13, which is positioned at the back focus position of the fourth lens 234, in the short axis direction.

As described above, with respect to the long axis direction, the modulation surface of the optical modulator 22 and the irradiated surface 131 of the scanning part 13 are optically conjugated. Further, the intensity distribution of the parallel beam L32 on the modulation surface of the optical modulator 22 in the long axis direction is the top hat distribution as shown in a rectangle frame of FIG. 3. Therefore, the intensity distribution of the modulated beam L33 on the irradiated surface 131 of the scanning part 13 in the long axis direction is also the top hat distribution.

Further, with respect to the short axis direction, the modulation surface of the optical modulator 22 and the front focus position of the fourth lens 234 (i.e., the back focus position of the third lens 233) are optically conjugated. Furthermore, the intensity distribution of the parallel beam L32 on the modulation surface of the optical modulator 22 in the short axis direction is converted by the beam shaper 213 into the top hat distribution as shown in a rectangle frame of FIG. 4. Therefore, the intensity distribution of the modulated beam L33 in the short axis direction, which has passed through the third lens 233, is the top hat distribution at the front focus position of the fourth lens 234. For this reason, the intensity distribution of the modulated beam L33 in the short axis direction at the focal point on the irradiated surface 131 of the scanning part 13 becomes a sinc distribution by the Fourier transform action of the fourth lens 234. Though there are some actual cases where the intensity distribution of the modulated beam L33 in the short axis direction is not an exact sinc distribution but is a distribution having a form approximate to the sinc function, both the exact sinc distribution and the distribution close to the sinc distribution are collectively referred to each as a "sinc distribution" in the following description. Since the sinc distribution has a main peak, almost like the Gaussian distribution, the modulated beam L33 can be suitably condensed on the irradiated surface 131 of the scanning part 13.

The size of the modulated beam L33 on the irradiated surface 131 of the scanning part 13 can be obtained as follows. It is assumed, for example, that the wavelength λ of the laser beam L31 is 1.070 μm, and the irradiation region on the modulation surface of the optical modulator 22 has a substantially linear shape (or a substantially rectangular shape) where the length $L_1$ in the long axis direction is 28 mm and the length $L_2$ in the short axis direction is 1 mm. It is also assumed that the respective focal lengths $f_1$ and $f_2$ of the first lens 231 and the second lens 232 on the short axis side are 40 mm and 400 mm and the respective focal lengths $f_3$ and $f_4$ of the third lens 233 and the fourth lens 234 are 240 mm and 60 mm. It is further assumed that the distance d between the second lens 232 and the third lens 233 is 50 mm. In this case, the composite focal length $f_{23}$ of the second lens 232 and the third lens 233 on the short axis side is about 163 mm.

With respect to the short axis direction, as described above, the modulated beam L33 is condensed at the back focus position of the first lens 231. The focus diameter (i.e., the dark ring diameter of the sinc function) $\varphi_{S1}$ of the modulated beam L33 in the short axis direction at the back focus position of the first lens 231 is $2.44 \times \lambda \times f_1/L_2 \approx 104$ μm. The back focus position of the first lens 231 and the irradiated surface 131 of the scanning part 13 are optically conjugated with respect to the short axis direction. Therefore, the focus diameter of the modulated beam L33 on the irradiated surface 131 in the short axis direction is 104 μm×$f_4/f_2 \approx 33$ μm.

With respect to the long axis direction, as described above, the modulated beam L33 is condensed at the back focus position of the third lens 233. The focus diameter $\varphi_{L3}$ of the modulated beam L33 in the long axis direction at the back focus position of the third lens 233 is $2.44 \times \lambda \times f_3/L_1 \approx 22$ μm. Further, the length $L_3$ of the modulated beam L33 in the short axis direction at the back focus position of the third lens 233 is $L_2 \times f_{23}/f_1 = 4$ mm. The modulation surface of the optical modulator 22 and the irradiated surface 131 of the scanning part 13 are optically conjugated with respect to the long axis direction. Therefore, the length of the modulated beam L33 on the irradiated surface 131 in the long axis direction is $L_1 \times f_4/f_3 = 7$ mm.

As described above, since the short axis side light shielding part 236 is disposed at the back focus position of the first lens 231, the irradiation regions 81 (see FIG. 5) of the first-order diffracted beam (i.e., +1st order diffracted beam and −1st order diffracted beam) emitted to both sides of the opening 236a of the short axis side light shielding part 236 in the short axis direction each have a substantially linear shape with $L_1 = 28$ mm in the long axis direction and $\varphi_{S1} \approx 104$ μm in the short axis direction. Further, since the long axis side light shielding part 235 is disposed at the back focus position of the third lens 233, the irradiation regions 82 (see FIG. 6) of the first-order diffracted beam emitted to both sides of the opening 235a of the long axis side light shielding part 235 in the long axis direction each have a substantially linear shape with $\varphi_{L3} \approx 22$ μm in the long axis direction and $L_3 = 4$ mm in the short axis direction.

On the other hand, in an assumed optical apparatus (hereinafter, referred to as an "optical apparatus of the comparative example") in which the modulated beam L33 is condensed by one convex lens at the same position (i.e., a back focus position of this convex lens) on the optical path both in the long axis direction and the short axis direction, the first-order diffracted beam is emitted to a point-like irradiation region on a light shielding part disposed at this back focus position. In a case, for example, where the focal length of this convex lens is 240 mm, the diameter of the irradiation region of the first-order diffracted beam on the light shielding part is about 326 μm.

Therefore, as compared with the optical apparatus of the comparative example, in the optical apparatus 12 of the present preferred embodiment, the power density of the first-order diffracted beam on the short axis side light shielding part 236 and the power density of the first-order diffracted beam on the long axis side light shielding part 235 are each reduced to one tenth or less.

In the three-dimensional modeling apparatus 1, as described above, the modulated beam L33 which is suitably condensed onto the irradiated surface 131 is scanned on the modeling material 91 inside the modeling space 140 by the scanning part 13. Then, by repeating the supply of the modeling material 91 into the modeling space 140 and the scan of the laser beam on the modeling material 91, the three-dimensional model is formed.

As described above, the optical apparatus 12 is an apparatus for emitting the modulated beam L33 onto the irradiated surface on the target object (the irradiated surface 131 of the scanning part 13 in the above-described exemplary case). The optical apparatus 12 includes the illumination optical system 21, the optical modulator 22, and the projection optical system 23. The illumination optical system 21 collimates the laser beam L31 into the parallel beam L32 which is long linear in the long axis direction. The optical modulator 22 modulates the parallel beam L32 into the modulated beam L33. The projection optical system 23 guides the modulated beam L33 onto the irradiated surface of the target object. The illumination optical system 21 includes the beam shaper 213. The beam shaper 213 converts the intensity distribution of the laser beam L31 in each of the short axis direction and the long axis direction, which is a Gaussian distribution, into the intensity distribution of the parallel beam L32 on the modulation surface of the optical modulator 22 in each of the short axis direction and the long axis direction, which is a top hat distribution.

The projection optical system 23 includes the first lens 231, the second lens 232, the third lens 233, and the fourth lens 234. The second lens 232 is positioned on the forward side in the traveling direction of the modulated beam L33, relative to the first lens 231. The third lens 233 is positioned on the forward side in the traveling direction of the modulated beam L33, relative to the first lens 231. The fourth lens 234 is positioned on the forward side in the traveling direction of the modulated beam L33, relative to the first lens 231, the second lens 232, and the third lens 233. The modulation surface and the irradiated surface are optically conjugated with respect to the long axis direction by the third lens 233 and the fourth lens 234. Further, the modulation surface and the front focus position of the fourth lens 234 are optically conjugated with respect to the short axis direction by the first lens 231, the second lens 232, and the third lens 233. The fourth lens 234 condenses a beam having the top hat distribution at the front focus position onto the irradiated surface 131.

Thus, by converting the intensity distribution of the laser beam L31 in each of the short axis direction and long axis direction into the top hat distribution by using the beam shaper 213, it is possible to reduce the maximum power density of the parallel beam L32 to be inputted to the optical modulator 22 and increase the total amount of inputted light. Therefore, it is possible to increase the amount of light to be inputted to the optical modulator 22 while reducing a damage risk of the optical modulator 22. Further, with the above-described constitution of the projection optical system 23, it is possible to convert the parallel beam L32 having the top hat distribution (in each of the short axis direction and the long axis direction) and entering the optical modulator 22 into the modulated beam L33 having the sinc distribution (in the short axis direction) with a main peak and suitably condense the modulated beam L33 onto the target object. As a result, it is possible to suitably increase the power density of the modulated beam L33 to be emitted to the target object.

In the projection optical system 23, it is preferable that the third lens 233 should be positioned on the forward side in the traveling direction of the modulated beam L33, relative to the second lens 232. In other words, it is preferable that the third lens 233 should be disposed between the second lens 232 and the fourth lens 234. If the second lens 232 is positioned on the forward side in the traveling direction of the modulated beam L33 relative to the third lens 233, since principal rays emitted from respective positions of the optical modulator 22 in the long axis direction enter the second lens 232 at different angles, there is a possibility that an aberration may occur. On the other hand, as described above, by disposing the third lens 233 on the forward side in the traveling direction of the modulated beam L33 relative to the second lens 232, the principal rays emitted from respective positions of the optical modulator 22 in the long axis direction enter the second lens 232 substantially perpendicularly thereto, and it is therefore possible to reduce the occurrence of the aberration.

As described above, it is preferable that the projection optical system 23 should further include the long axis side light shielding part 235 and the short axis side light shielding part 236. The long axis side light shielding part 235 is positioned between the third lens 233 and the fourth lens 234 and blocks the non-zero-order diffracted beam on the long axis side from the optical modulator 22. The short axis side light shielding part 236 is positioned between the first lens 231 and the second lens 232 and between the first lens 231 and the third lens 233 and blocks the non-zero-order diffracted beam on the short axis side from the optical modulator 22. Thus, in the optical apparatus 12, the respective condensing positions of the modulated beams L33 on the optical path of the projection optical system 23 in the long axis direction and short axis direction are made different from each other and the respective non-zero-order diffracted beams on the long axis side and short axis side are blocked at the respective condensing positions, and as described above, the first-order diffracted beams are thereby emitted to the substantially linear irradiation regions 81 and 82 on the long axis side light shielding part 235 and the short axis side light shielding part 236. For this reason, as compared with the case where the first-order diffracted beam is emitted to the point-like irradiation region, like in the above-described comparative example, it is possible to significantly reduce the power density of the first-order diffracted beam on each of the long axis side light shielding part 235 and the short axis side light shielding part 236. It is thereby possible to reduce the risk of damaging the long axis side light shielding part 235 and the short axis side light shielding part 236 by the non-zero-order diffracted beam such as the first-order diffracted beam or the like and achieve simplification of the respective structures of the long axis side light shielding part 235 and the short axis side light shielding part 236 (for example, thinning of the plate-like member).

As described above, it is preferable that the long axis side light shielding part 235 should be positioned at the back focus position of the third lens 233. Since the size of the irradiation region of the non-zero-order diffracted beam such as the first-order diffracted beam or the like on the long axis side light shielding part 235 can be thereby reduced, it is possible to reduce the area of a portion which is light-shielded by the long axis side light shielding part 235. Further, it is preferable that the short axis side light shielding part 236 should be positioned at the back focus position of the first lens 231. Since the size of the irradiation region of the non-zero-order diffracted beam such as the first-order diffracted beam or the like on the short axis side light shielding part 236 can be thereby reduced, it is possible to reduce the area of a portion which is light-shielded by the short axis side light shielding part 236.

On the other hand, it is also preferable that the long axis side light shielding part 235 should be disposed at a position other than the back focus position of the third lens 233. Since the power density of the non-zero-order diffracted beam such as the first-order diffracted beam or the like on the long axis side light shielding part 235 can be thereby reduced, it is possible to further reduce the risk of damaging the long axis side light shielding part 235 by the non-zero-order diffracted beam. Further, it is also preferable that the short axis side light shielding part 236 should be disposed at a position other than the back focus position of the first lens 231. Since the power density of the non-zero-order diffracted beam such as the first-order diffracted beam or the like on the short axis side light shielding part 236 can be thereby reduced, it is possible to further reduce the risk of damaging the short axis side light shielding part 236 by the non-zero-order diffracted beam.

As described above, it is preferable that the optical modulator 22 should include the plurality of modulator elements (i.e., pixels 221) which are two-dimensionally arrayed. Since the parallel beam L32 from the illumination optical system 21 can be thereby emitted onto the optical modulator 22 in a planar form, it is possible to reduce the maximum power density of the parallel beam L32 in the irradiation region on the optical modulator 22 while increasing the total amount of light to be inputted to the optical modulator 22. As a result, it is possible to further reduce the damage risk of the optical modulator 22.

As described above, it is preferable that the optical modulator 22 should be a PLY. Having high power resistance performance, the PLY is especially suitable for the optical modulator 22 required to increase the amount of inputted light.

The three-dimensional modeling apparatus 1 includes the optical apparatus 12, the laser light source 11, and the scanning part 13 described above. The laser light source 11 emits the laser beam L31 to the optical apparatus 12. The scanning part 13 is the above-described target object irradiated with the modulated beam L33 from the optical apparatus 12 and scans the modulated beam L33 on the modeling material 91. Since the power density of the modulated beam L33 emitted onto the target object (i.e., the scanning part 13) can be suitably increased in the optical apparatus 12 as described above, the power density of the modulated beam L33 emitted onto the modeling material 91 can be also increased in the three-dimensional modeling apparatus 1. As a result, it is possible to increase the modeling speed of a modeled object in the three-dimensional modeling apparatus 1 and increase the productivity.

As described above, it is preferable that the scanning part 13 should include the galvanometer mirror 132 which rotates to change the traveling direction of the modulated beam. It is thereby possible to perform scanning of the modulated beam L33 from the optical apparatus 12 at high speed with high accuracy.

In the three-dimensional modeling apparatus 1, as described earlier, it is preferable that the scan direction of the modulated beam L33 by the scanning part 13 should be a direction corresponding to the short axis direction of the modulated beam L33. Since the intensity distribution of the modulated beam L33 on the modeling material 91 in the short axis direction is the above-described sinc distribution, there is a bright ring around the focal point and a region on the front side relative to the focal point in the scan direction (i.e., short axis direction) is preheated by the bright ring. For this reason, when the preheated region is scanned with the modulated beam L33, it is possible to reduce the heating time of this region. As a result, it is possible to further increase the productivity of the three-dimensional modeling apparatus 1.

In the optical apparatus 12 and the three-dimensional modeling apparatus 1 described above, various modifications can be made.

For example, the optical modulator 22 of the optical apparatus 12 is not limited to the above-described PLY, GLV or DMD but may be changed in various manners. Further, the optical modulator 22 does not always need to include the plurality of modulator elements which are two-dimensionally arranged but may include a plurality of modulator elements which are linearly arranged.

In the projection optical system 23, for example, in a case where the above-described aberration is within tolerance, where an optical element for correcting the aberration is additionally provided, or the like case, the second lens 232 may be disposed on the forward side in the traveling direction of the modulated beam L33, relative to the third lens 233.

The scanning part 13 of the three-dimensional modeling apparatus 1 does not always need to include the galvanometer mirror 132 but may have another structure such as a polygon laser scanner or the like as described above. Alternatively, the scanning part 13 is not limited to one that changes the traveling direction of the modulated beam L33 from the projection optical system 23 but may be, for example, a moving mechanism such as a linear motor or the like for moving the modeling part 141 in a horizontal direction, which holds the modeling material 91 with the irradiation position of the modulated beam L33 fixed.

The optical apparatus 12 does not always need to be provided in the three-dimensional modeling apparatus 1 but may be used in, for example, a laser beam machine such as a laser marking apparatus or the like.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Three-dimensional modeling apparatus
11 Laser light source
12 Optical apparatus
13 Scanning part
21 Illumination optical system
22 Optical modulator
23 Projection optical system
91 Modeling material
131 Irradiated surface
132 Galvanometer mirror
213 Beam shaper
221 Pixel
231 First lens
232 Second lens
233 Third lens
234 Fourth lens
235 Long axis side light shielding part
236 Short axis side light shielding part
L31 Laser beam
L32 Parallel beam
L33 Modulated beam

The invention claimed is:

1. An optical apparatus for emitting a modulated beam onto an irradiated surface on a target object, comprising:
   an illumination optical system for collimating a laser beam into a parallel beam which is long linear in a long axis direction;
   an optical modulator for modulating said parallel beam into a modulated beam; and
   a projection optical system for guiding said modulated beam onto an irradiated surface of a target object,
   wherein said illumination optical system comprises a beam shaper for converting an intensity distribution of said laser beam in each of a short axis direction and said long axis direction, which is a Gaussian distribution, into an intensity distribution of said parallel beam on a modulation surface of said optical modulator in each of said short axis direction and said long axis direction, which is a top hat distribution,
said projection optical system comprises
a first lens;
a second lens positioned on the forward side in the traveling direction of said modulated beam, relative to said first lens;
a third lens positioned on the forward side in the traveling direction of said modulated beam, relative to said first lens; and
a fourth lens positioned on the forward side in the traveling direction of said modulated beam, relative to said first lens, said second lens, and said third lens,
said modulation surface and said irradiated surface are optically conjugated with respect to said long axis direction by said third lens and said fourth lens, and
said modulation surface and a front focus position of said fourth lens are optically conjugated with respect to said short axis direction by said first lens, said second lens, and said third lens, and said fourth lens condenses a beam having a top hat distribution at said front focus position onto said irradiated surface.

2. The optical apparatus according to claim 1, wherein said third lens is positioned on the forward side in the traveling direction of said modulated beam, relative to said second lens.

3. The optical apparatus according to claim 2, wherein said projection optical system further comprises
a long axis side light shielding part which is positioned between said third lens and said fourth lens and blocks a non-zero-order diffracted beam on a long axis side from said optical modulator; and
a short axis side light shielding part which is positioned between said first lens and said second lens and between said first lens and said third lens and blocks a non-zero-order diffracted beam on a short axis side from said optical modulator.

4. The optical apparatus according to claim 3, wherein said optical modulator comprises a plurality of modulator elements which are two-dimensionally arranged.

5. The optical apparatus according to claim 4, wherein said optical modulator is a PLY.

6. The optical apparatus according to claim 1, wherein said projection optical system further comprises
a long axis side light shielding part which is positioned between said third lens and said fourth lens and blocks a non-zero-order diffracted beam on a long axis side from said optical modulator; and
a short axis side light shielding part which is positioned between said first lens and said second lens and between said first lens and said third lens and blocks a non-zero-order diffracted beam on a short axis side from said optical modulator.

7. The optical apparatus according to claim 6, wherein said optical modulator comprises a plurality of modulator elements which are two-dimensionally arranged.

8. The optical apparatus according to claim 7, wherein said optical modulator is a PLY.

9. The optical apparatus according to claim 1, wherein said optical modulator comprises a plurality of modulator elements which are two-dimensionally arranged.

10. The optical apparatus according to claim 9, wherein said optical modulator is a PLY.

11. A three-dimensional modeling apparatus, comprising:
said optical apparatus according to claim 1;
a laser light source for emitting said laser beam to said optical apparatus; and
a scanning part which is said target object irradiated with said modulated beam from said optical apparatus and scans said modulated beam on a modeling material.

12. The three-dimensional modeling apparatus according to claim 11, wherein
said scanning part comprises a galvanometer mirror which rotates to change the traveling direction of said modulated beam.

* * * * *